United States Patent
Qi

(10) Patent No.: US 9,590,164 B2
(45) Date of Patent: Mar. 7, 2017

(54) ENCAPSULATED PIEZOELECTRIC VALVE

(71) Applicant: Parker-Hannifin Corporation, Cleveland, OH (US)

(72) Inventor: Yufeng Qi, Grand Rapids, MI (US)

(73) Assignee: Parker-Hannifin Corporation, Cleveland, OH (US)

( * ) Notice: Subject to any disclaimer, the term of this patent is extended or adjusted under 35 U.S.C. 154(b) by 281 days.

(21) Appl. No.: 14/211,563

(22) Filed: Mar. 14, 2014

(65) Prior Publication Data

US 2014/0325808 A1  Nov. 6, 2014

Related U.S. Application Data

(60) Provisional application No. 61/818,944, filed on May 3, 2013.

(51) Int. Cl.
| | |
|---|---|
| *H01L 41/04* | (2006.01) |
| *H01L 41/053* | (2006.01) |
| *F16K 31/00* | (2006.01) |
| *H01L 41/09* | (2006.01) |
| *H01L 41/22* | (2013.01) |

(52) U.S. Cl.
CPC ........ *H01L 41/0533* (2013.01); *F16K 31/005* (2013.01); *F16K 31/007* (2013.01); *H01L 41/042* (2013.01); *H01L 41/09* (2013.01); *H01L 41/22* (2013.01); *Y10T 29/42* (2015.01)

(58) Field of Classification Search
CPC  H02N 2/02; H02N 2/021; H02N 2/04; H02N 2/043
USPC ........................................... 310/328
See application file for complete search history.

(56) References Cited

U.S. PATENT DOCUMENTS

| | | | |
|---|---|---|---|
| 6,157,115 A * | 12/2000 | Hassler, Jr. ............ | H02N 2/043 310/328 |
| 6,759,790 B1 | 7/2004 | Bugel et al. | |
| 7,132,781 B2 | 11/2006 | Moler et al. | |
| 8,402,949 B2 | 3/2013 | Kondo et al. | |
| 2002/0163282 A1 | 11/2002 | Heinz | |
| 2004/0151629 A1 | 8/2004 | Pease et al. | |
| 2006/0087202 A1 | 4/2006 | Flaemig-Vetter et al. | |
| 2013/0234561 A1* | 9/2013 | Moler ................... | H01L 41/053 310/328 |
| 2014/0077660 A1* | 3/2014 | Knight ................... | H02N 2/043 310/328 |

FOREIGN PATENT DOCUMENTS

| | | |
|---|---|---|
| DE | 10 2007 004 552 | 7/2008 |
| EP | 1 252 414 B1 | 10/2006 |

OTHER PUBLICATIONS

International Search Report and Written Opinion dated Jul. 14, 2014 for corresponding International application No. PCT/US2014/031951.

(Continued)

*Primary Examiner* — Derek Rosenau
(74) *Attorney, Agent, or Firm* — Renner, Otto, Boisselle & Sklar, LLP.

(57) ABSTRACT

An actuator assembly includes a housing and an actuator arranged within the housing, the actuator including a first part and a second part movable relative to the first part. An insulating material is disposed within the housing, the insulating material encapsulating at least the movable part of the actuator.

12 Claims, 5 Drawing Sheets

(56) References Cited

OTHER PUBLICATIONS

International Preliminary Report on Patentability dated Apr. 10, 2015 for corresponding International application No. PCT/US2014/031951.
"Dow Corning 3-4154 Dielectric Gel", www.dowcorning.com; product information; 3 pages; 2008.

* cited by examiner

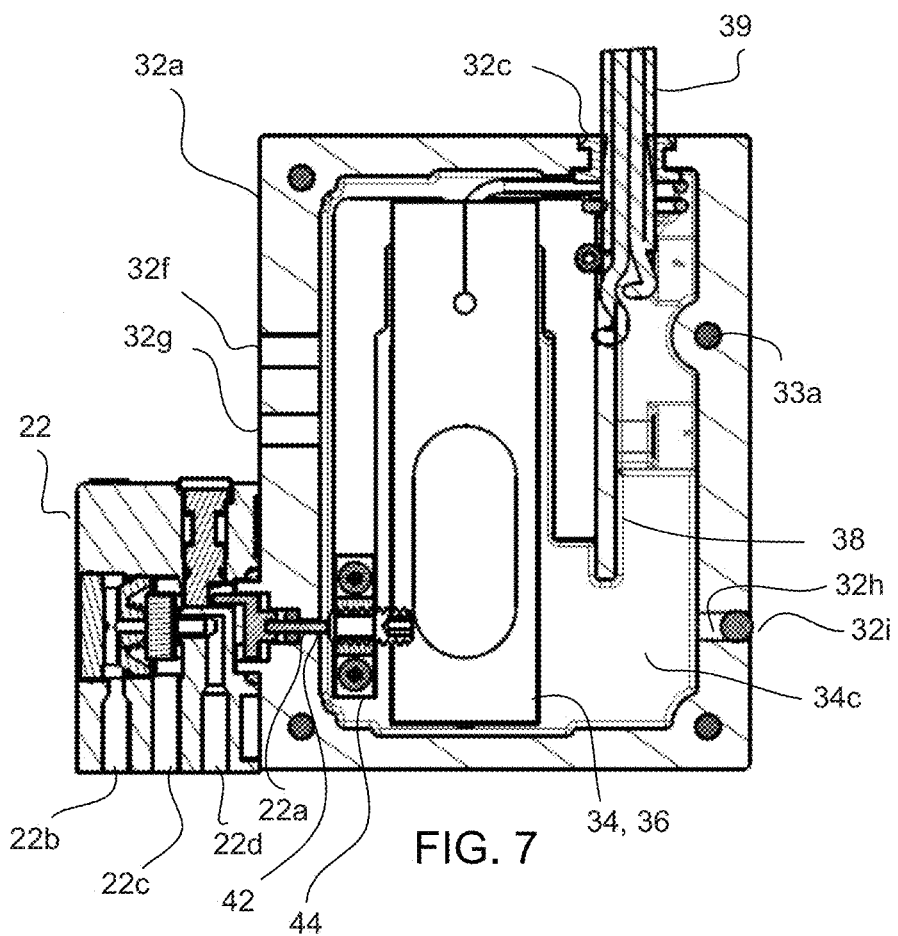

ENCAPSULATED PIEZOELECTRIC VALVE

RELATED APPLICATION DATA

This application claims priority of U.S. Provisional Application No. 61/818,944 filed on May 3, 2013, which is incorporated herein by reference in its entirety.

FIELD OF INVENTION

The present disclosure relates generally to valves, and more particularly to a piezoelectric valve that utilizes an encapsulated amplified piezoelectric actuator and electronic components to mitigate the risks associated with spark generation by the piezoelectric actuator.

BACKGROUND

Amplified piezoelectric actuators utilize a piezoelectric actuator and a displacement amplifier to generate a mechanical action. The piezoelectric actuator can be in form of a stack, bender or membrane. By applying a voltage to the piezoelectric actuator and removing the voltage from the piezoelectric actuator, the piezoelectric actuator undergoes displacement (e.g., expansion and contraction), the displacement having a force component. However, for most industrial applications typical piezoelectric actuators have very limited displacement with significant force. Therefore, various amplifier design approaches are adopted to amplify the displacement, which consequently reduces the force component. One of the most popular amplifier designs is a lever arm design. With such design, a piezoelectric actuator can be mechanically coupled to a device, such as a valve, thereby enabling the valve to be electrically opened or closed, e.g., by applying a voltage to and removing the voltage from the piezoelectric actuator.

Piezoelectric actuators used for valve applications typically require relatively high voltage to generate useful displacement and force. The voltage typically is on the order of 70 volts and up. Combined with the piezoelectric actuator's capacitive nature, stored energy and risk of spark generation in failure mode have been a concern, particularly in applications in which the environment could be explosive. In order to use piezoelectric actuators in such applications, the actuation voltage typically is lowered and the size of the piezoelectric actuator is reduced to limit the stored energy.

One major drawback of the above approach is that the displacement (also referred to as stroke) and force provided by the piezoelectric actuator become limited. This can result in insufficient displacement of the valve mechanism (resulting in limited flow) and/or reduced force (resulting in leakage at the valve close position).

SUMMARY OF INVENTION

Encapsulation, or potting, is a well-established process designed to protect electronic circuitry. Encapsulation provides protection from vibration, humidity, chemical attack, etc., and also improves dielectric strength of the system. Encapsulants (also referred to as potting compounds) are often in liquid form during the encapsulation process and become solid once fully cured. In some cases, the fully cured form of the encapsulant can be semi-solid to provide greater vibration resistance and reduce stress caused by wide thermal cycles.

Amplified piezoelectric actuators have utilized piezoelectric actuators that are coated with resin. Resin coating provides basic humidity protection and improves handling. However, encapsulation of an amplified piezoelectric actuator itself has not been implemented, as such encapsulation would prevent the amplified piezoelectric actuator from providing the desired displacement and force components.

According to one aspect of the present disclosure, an amplified piezoelectric actuator is encapsulated within an encapsulant, the encapsulant having a relatively low viscosity that remains soft and pliable after cure so as to not significantly impede displacement of the actuator.

In one embodiment, an actuator assembly includes: a housing; an actuator arranged within the housing, the actuator including a first part and a second part movable relative to the first part; and an insulating material disposed within the housing, the insulating material encapsulating at least the movable part of the actuator.

In one embodiment, the actuator assembly includes a valve assembly attached to the housing and operatively coupled to the second part of the actuator to selectively open and close the valve by actuation of the encapsulated actuator.

In one embodiment, the valve comprises at least one of a spool valve or a poppet valve.

In one embodiment, the actuator comprises a piezoelectric actuator.

In one embodiment, the movable part comprises a piezoelectric element.

In one embodiment, the actuator assembly includes electronics arranged with the housing and configured to control movement of the second part relative to the first part, the insulating material encapsulating the electronics.

In one embodiment, the insulating material comprises a silica gel.

In one embodiment, the insulating material comprises a dielectric gel.

In one embodiment, the insulating material is formed from a mixture of a first gel part with a second curing part.

In one embodiment, the insulating material is formed from a single part.

In one embodiment, a viscosity of the insulating material after being cured is greater than a viscosity of the insulating material prior to being cured.

In one embodiment, the actuator assembly includes an amplifier arranged in the housing and mechanically coupled to the actuator, wherein the insulating material encapsulates the amplifier.

In one embodiment, the amplifier amplifies movement of the actuator.

In one embodiment, the amplifier comprises a pivotable folded-back arm actuator configuration.

In one embodiment, a gain of the amplifier is between 25 and 35.

In one embodiment, the electronics comprise a printed circuit board.

In one embodiment, a method for creating an intrinsically safe actuator assembly includes: arranging an actuator in a housing, the actuator including a first part and a second part movable relative to the first part; and disposing an insulating material within the housing, the insulating material encapsulating at least the movable part of the actuator.

In one embodiment, the method includes operatively coupling a valve to the actuator to selectively open and close the valve by actuation of the actuator.

In one embodiment, arranging an actuator in the housing comprises arranging a piezoelectric actuator in the housing.

In one embodiment, arranging an actuator in the housing comprises arranging electronics in the housing, wherein the electronics are configured to control movement of the second part relative to the first part, and wherein disposing the insulating material includes encapsulating the electronics.

In one embodiment, disposing an insulating material comprises disposing a silica gel within the housing, the silica gel encapsulating the actuator.

In one embodiment, the method includes arranging an amplifier in the housing and mechanically coupling the amplifier to the actuator, wherein the insulating material encapsulates the amplifier.

The foregoing and other features of the invention are hereinafter described in greater detail with reference to the accompanying drawings.

BRIEF DESCRIPTION OF THE DRAWINGS

FIG. 7 is cross-section of the exemplary valve assembly according to FIG. 5.

DETAILED DESCRIPTION

The inventive aspects in accordance with the present disclosure will be described in the context of a pneumatic valve. It should be appreciated, however, that aspects of the present disclosure are not limited to pneumatic valves, but also can be applied to other electro-mechanical actuators in which an intrinsically safe device is desired.

Figure 1:
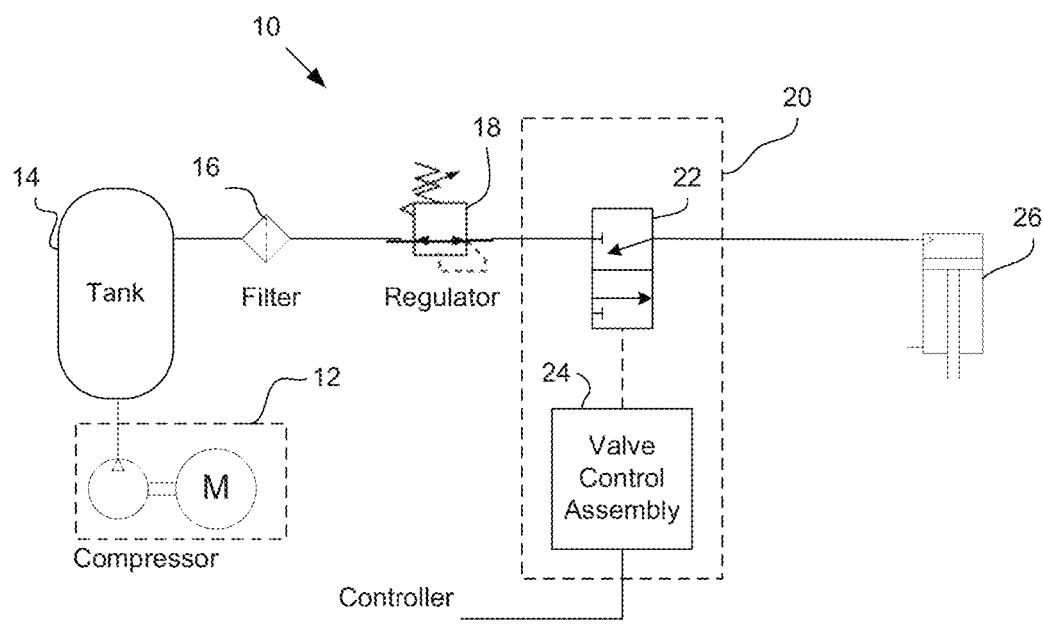
FIG. 1 is a schematic representation of an exemplary pneumatic system utilizing an exemplary valve assembly in accordance with the present disclosure.

Referring now to FIG. 1, an exemplary pneumatic system 10 is schematically illustrated that may be used with a valve assembly in accordance with the present disclosure. The system 10 includes a compressor assembly 12 having a compressed-air outlet coupled to an inlet of a storage tank 14. Air compressed by the compressor assembly 12 is stored in the tank 14 for use by pneumatic devices as is conventional. An outlet of the storage tank 14 is provided to an inlet of a filter 16, which filters the air and/or removes moisture from the air. The output of the filter 16 is provided to an input of a regulator 18, which regulates air pressure in the system 10. An outlet of the regulator is provided to an inlet of a valve assembly 20 in accordance with the present disclosure. As will be described in more detail below, the valve assembly 20 includes a valve 22 and a valve control assembly 24 coupled to the valve 22, the valve control assembly operative to open and close the valve 22. An outlet of the valve assembly 20 is provided to an inlet of a pneumatic device 26, such as a pneumatic cylinder, for example. By opening and closing the valve 22 of the valve assembly 20, pneumatic power can be selectively provided to the cylinder 26.

Figure 2:
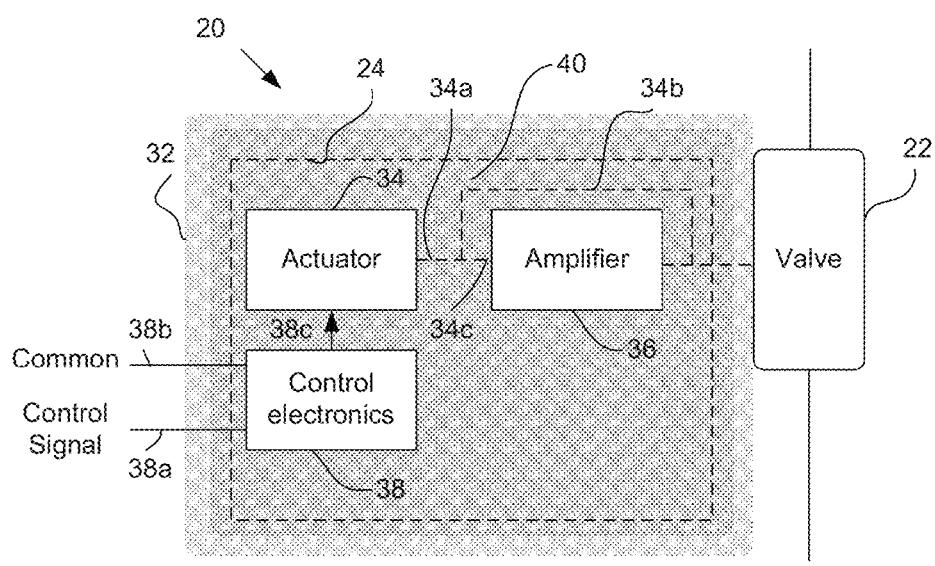
FIG. 2 is a block diagram of an exemplary valve assembly in accordance with the present disclosure.

Referring now to FIG. 2, the valve assembly 20 is schematically shown in more detail. The valve assembly 20 includes a housing 32 adapted to enclose components of the valve assembly 20 and to provide a support structure for the valve 22. The housing 32 may be formed from any suitable material, such as metal (steel, aluminum, etc.), plastic, nylon and the like. Arranged within the housing 32 is an actuator 34 for manipulating the valve 22 between an open and closed state. Preferably, the actuator 34 comprises a piezoelectric actuator and may be in the form of a piezoelectric stack, a piezoelectric bender or a piezoelectric membrane.

A first part of the actuator 34, such as a support structure or the like (not shown in FIG. 2), is fixed to housing 32 using a fastening means. In one embodiment, the fastening means comprise threaded fasteners, such as screws, nuts and bolts, and the like. In another embedment, the fastening means comprise an adhesive material disposed between the amplifier 36 or housing 32 and the support structure of the actuator 34.

A second part of the actuator 34a, which is movable relative to the first part of the actuator, is mechanically coupled to valve 22. In one embodiment, the second part 34a of the actuator 34 is directly coupled 34b to the valve 22. In another embodiment the second part 34a of the actuator 34 is indirectly coupled 34c to the valve 22 using, for example, amplifier 36 or the like. While the amplifier 36 is shown separate from the actuator 34, such amplifier 36 may be formed integrally with the actuator 34.

The amplifier 36, which can be attached to the housing 32 in the same manner as the actuator, can amplify the displacement and force components of the second part 34a of the actuator 34 (e.g., to provide a greater displacement). For example, by coupling an amplifier 36, such as a lever, between the actuator 34 and the valve 22, the displacement of the actuator 34 can be increased, thus providing greater control of the valve 22. In one embodiment, the amplifier 36 has a gain between 25 and 35. In one embodiment, the amplifier includes a pivotable folded-back arm actuator configuration, as described in more detail below.

The valve 22 is mounted to an external surface of the housing 32, preferably using threaded fasteners, although other fastening means may be used without departing from the scope of the invention. In one embodiment the valve 22 is a poppet valve, and in another embodiment the valve 22 is a spool valve. Formed within the housing 32 is an opening (not shown in FIG. 2) to enable a mechanical coupling between the valve 22 and the actuator 34 and/or amplifier 36.

Also mounted within the housing are control electronics 38, which may be fastened to the housing in the same manner referenced above with respect to the actuator 34 and amplifier 36. The control electronics 38 include circuitry configured to control movement of the second part 34a of the actuator 34 relative to the first part of the actuator 34. In one embodiment, the control electronics 38 include a printed circuit board with active and/or passive components arranged thereon. The control electronics 38 include an input connection 38a and 38b for receiving a control signal from a remote device, such as a central controller (not shown), and an output 38c electrically connected to an input of the actuator 34. The control electronics 38 can be a two wire system (shown, control signal 38a and common 38b) or a three wire system (no shown, power, control signal and common).

After the actuator 34, the (optional) amplifier 36 and the control electronics 38 are mounted inside the housing 32 and operatively coupled to each other and/or the valve 22, an insulating material 40 is disposed in the housing so as to fill the housing and encapsulate the actuator 34, the (optional) amplifier 36 and the control electronics 38. As used herein, the term "encapsulate" is defined as to encase one or more objects within a material such that at least portions of the one or more objects are within the material. Preferably, the entire object is within the material. Encapsulation of objects isolates the objects from the ambient environment.

The insulating material 40 can be any suitable material that allows mechanical movement of the actuator 34 and amplifier 36 while encapsulated and prevents the transmission of a spark from electrical shorts, overloads or component failures. The insulating material 40 can also provide insulation, moisture prevention, and shock/vibration absorption. As used herein the term "insulating material" does not encompass gasses by themselves. An insulating material includes gels and pastes. A gel is defined as a substantially dilute cross-linked material that exhibits no flow when in the steady-state.

The insulating material 40 preferably is a low viscosity potting compound that remains soft after fully cured and across wide operating temperature ranges. The insulating material 40 may include, but is not limited to, silica gels, urethanes, epoxies, etc. Dielectric properties of the insulating material 40 keep the actuator 34 and associated control electronics 38 insulated, while the low (after cured) viscosity allows full encapsulation of both the control electronics 38 and the actuator 34 without affecting the actuator's (and optional amplifier's) mechanical movement in a significant way.

The insulating material may be formed from a mixture of a first gel part with a second curing part, where the viscosity of the insulating material after being cured is greater than a viscosity of the insulating material prior to being cured. In one embodiment, the insulating material has a cured dynamic viscosity between 545 to 555 mPA-sec.

Once the insulating material 40 has cured, the valve 22 can be selectively opened and closed by providing a control signal at the input 38a and 38b of the control electronics 38. Such control signal causes the control electronics 38 to apply or remove, for example, a voltage signal to the actuator 34 thus causing actuator displacement. By virtue of the mechanical coupling between the actuator 34 and the valve 22, control of the valve 22 is achieved.

Figure 3:
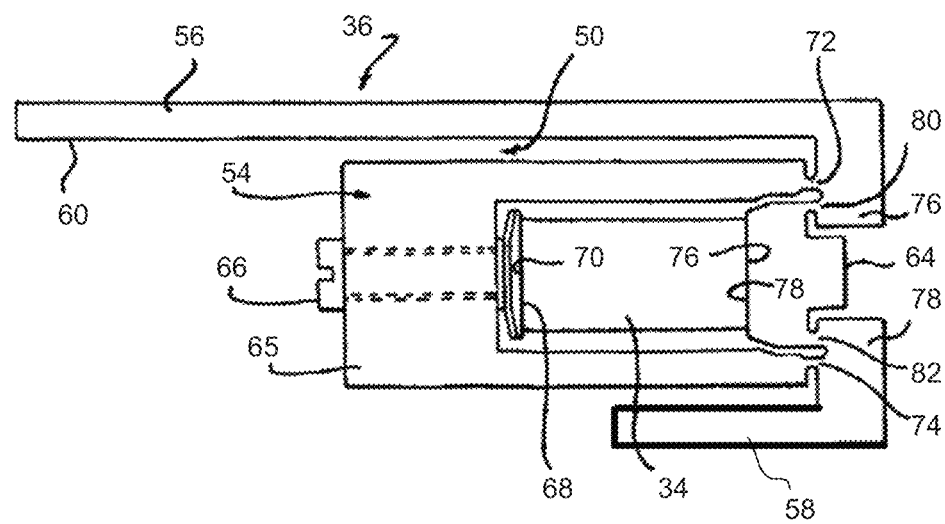
FIG. 3 is a side view of an exemplary amplified piezoelectric actuator assembly that may be used in the valve assembly in accordance with the present disclosure.
Figure 4:
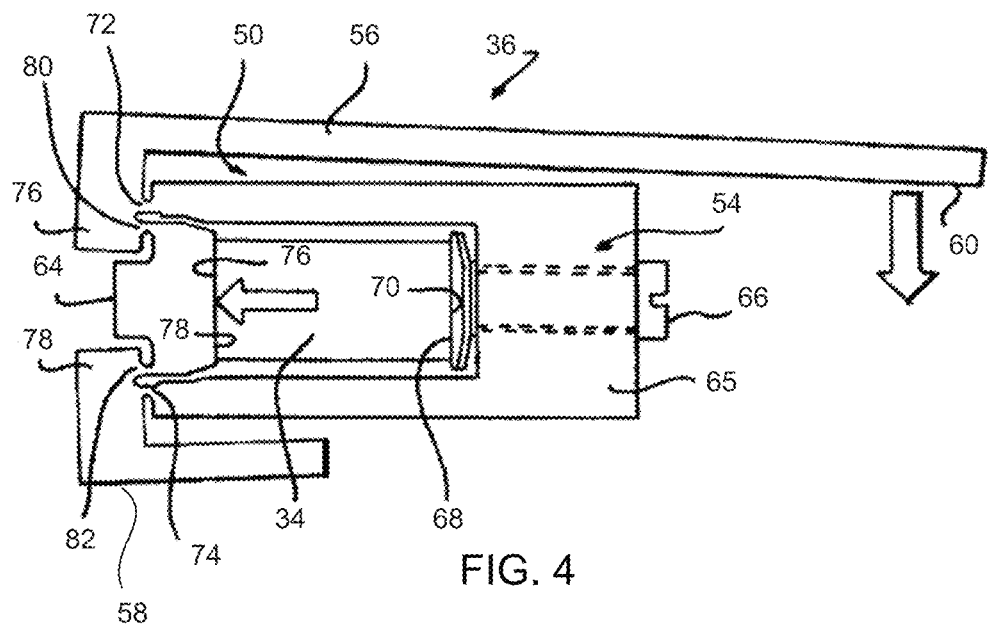
FIG. 4 is a side view of the exemplary amplified piezoelectric actuator assembly of FIG. 3 in the activated state.

With additional reference to FIGS. 3-4, shown is an exemplary actuator and amplifier assembly that may be used in the valve assembly 20 in accordance with the present disclosure. As will be described in more detail below, the actuator of the assembly includes a piezoelectric actuator and the amplifier of the assembly includes a swept back arm design with a centralized piezoelectric stack such that movement of the stack is amplified.

FIG. 3 is a side view of the exemplary actuator and amplifier assembly, which includes a support 50 and an actuator element 34 arranged relative to the support 50. Preferably, the actuator element 34 is a piezoelectric element, and may be formed as a piezoelectric stack. The support 50 includes a rigid, non-flexible portion 54, at least one pivotable arm portion, such as first pivotable arm portion 56 extending rearward from the rigid portion 54, a base portion 58, a movable surface 60 on the pivotable arm portion 56 for movement relative to the base portion 58, and a force transfer member 64 operably positioned relative to the first pivotable arm portion 56 and the base portion 58. Preferably, the support 50 is a unitary, integral, single-piece monolithic body.

The actuator element 34 is operably engaged between the rigid, non-flexible portion 54 and the force transfer member 64 to drive the force transfer member 64 in linear motion away from the rigid, non-flexible portion 54. The rigid non-flexible portion 54 receives an adjustable support 66 with an adjustable seat 68 having a complementary surface to the end 70 of the actuator element 34. The complementary surface of the adjustable seat 68 can be flat or shaped in any manner to support the actuator element 34 in a position suitable for driving the force transfer member 64 in response to an electrical actuation of the actuator element 34. Movement of the force transfer member 64 pivots at least one pivotable arm portion 56, 58 about at least one living hinge 72, 74 with a loss of motion of less than 40%. At least one living hinge 72, 74 extends between each rigid arm portion and a pivotal base portion 76, 78 of each corresponding pivotable arm portion, and at least one living hinge 80, 82 extends between the corresponding base portion 76, 78 of the pivotable arm portions and the force transfer member 64.

The control electronics 38 can provide a charging voltage across the actuator element 34 (e.g., a piezoelectric device) to produce spatial displacement along a predetermined axis. The amount of electrical charge stored by the piezoelectric device is generally proportional to the amount of voltage applied across the piezoelectric device. Thus, varying the amount of voltage applied across the piezoelectric device can control the amount of spatial displacement along one predetermined axis. This spatial displacement is transferred and amplified via the living integral hinge 72, 74 into at least one pivotable arm 56 and base 58 causing the corresponding the surface 60 to move in a curvilinear path relative to the base portion 58.

In FIG. 3, the actuator element 34 is deactivated. The surface 60 is in a first position when the actuator element 34 is deactivated. This type of configuration is commonly referred to as a normally open design. When the actuator element 34 is electrically activated, the set end 70 of actuator element 34 is held fixed by the rigid portion 54, the driving end 76 of the actuator element 34 drives the force transfer member 64 away or apart from the rigid web 65, and pivotable arm 56 is pivoted about living hinge 72. In this manner, the space or distance between the surface 60 and the base portion 58 is decreased. The distance between the surface 60 and the base portion 58 can be increased or decreased by adjusting the voltage across the actuator element 34. FIG. 4 illustrates the planar driving end 76 of the actuator element 34 in operable contact with the planar seat surface 78 of the force transfer member 64 when the actuator element 34 is fully activated and is exaggerated to show a larger closing between the opposing surfaces 60, 62.

In the embodiment illustrated in FIGS. 3-4, the components have been machined from a single monolithic piece of metallic material for example stainless steel. Other suitable materials can include powdered metal, metallic alloys, composite materials, or a combination of metallic and composite materials. Although these materials given as examples provide excellent performance, depending on the requirements of a particular application, use of other materials for the support can be appropriate. Some components like the pivotable arm portions can be manufactured separate from the rigid non-flexing generally C-shaped or generally U-shaped structure and joined later to define the generally W-shaped or generally M-shaped combined structure. Additional details concerning the combined actuator and amplifier assembly can be found in U.S. Pat. Nos. 6,759,790 and 8,402,949, the contents of each incorporated herein by reference in its entirety.

Figure 5:
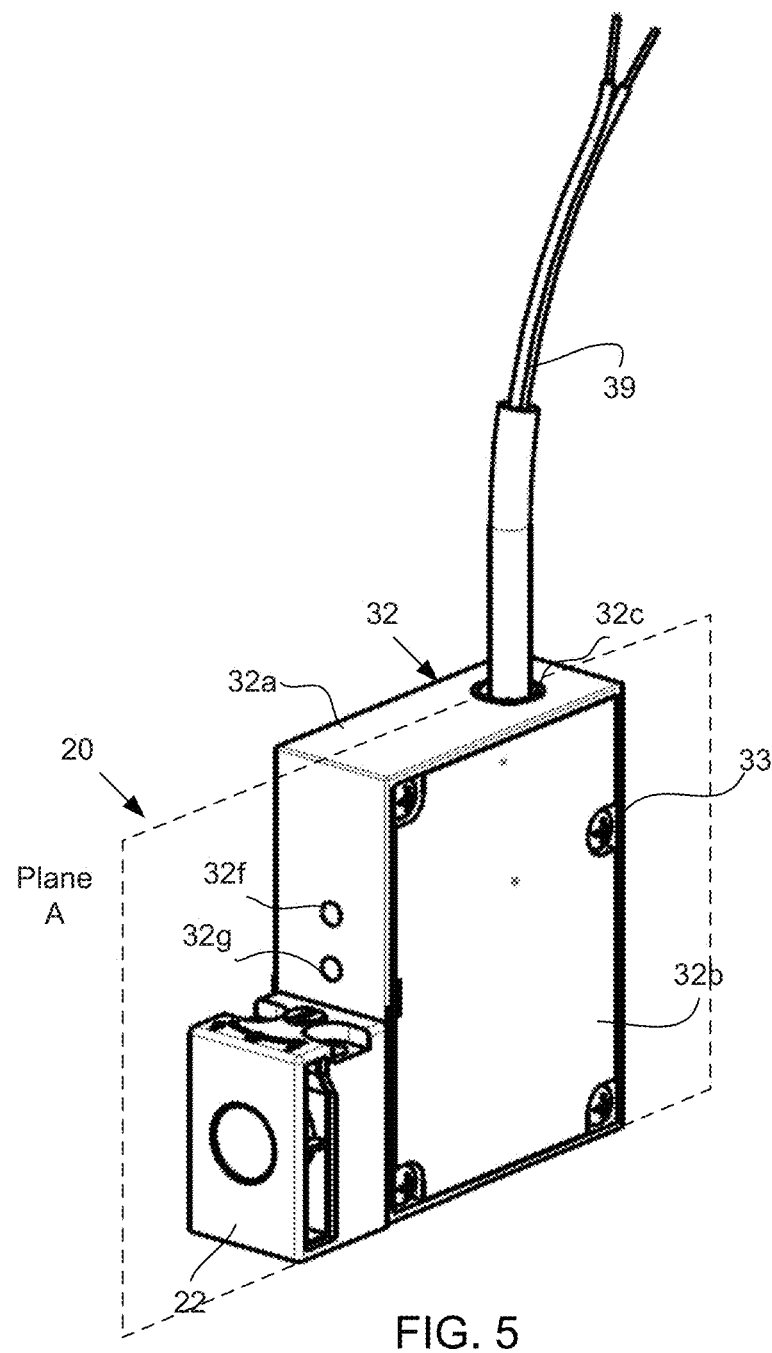
FIG. 5 is a perspective view of an exemplary valve assembly in accordance with the present disclosure.

Referring now to FIG. 5, a perspective view of an exemplary valve assembly 20 in accordance with the present disclosure is illustrated in an assembled state. The valve assembly includes a housing 32 formed from a first housing portion 32a and a second housing portion 32b (e.g., a cover), in which in the present embodiment is formed as a rectangular housing, and a valve 22 attached to an outer surface of the first housing portion 32a. The cover 32b is arranged over the insulating material (not shown in FIG. 5) and is fixed to the first housing portion 32a via fasteners 33. Preferably, the second housing portion 32b is a transparent cover that enables the interior of the housing 32 to be viewed during the encapsulation process. Power and control signals are provide to the control electronics 38 via cable 39, which passes through an opening 32c within the first housing portion 32a.

Figure 6:
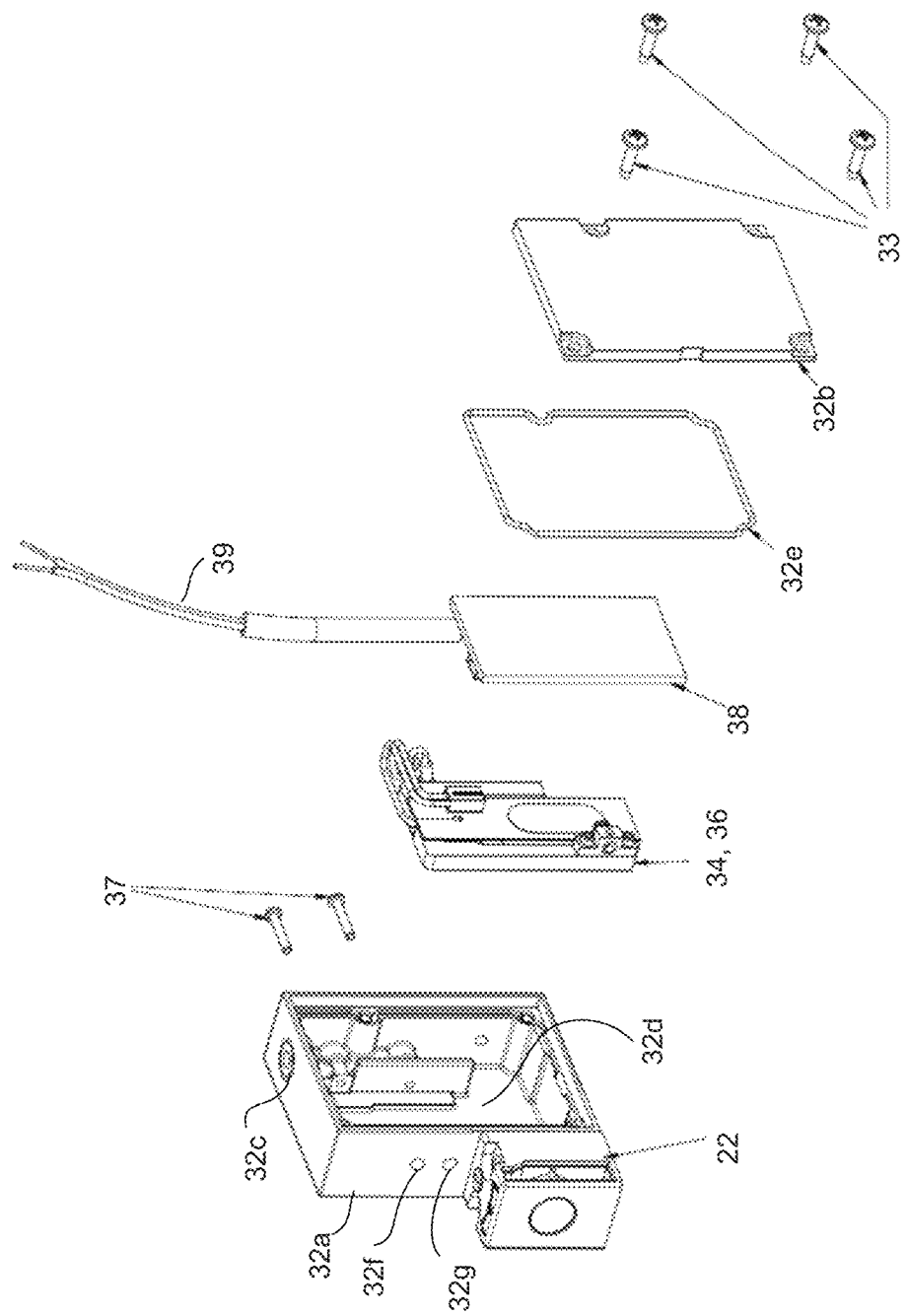
FIG. 6 is an exploded view of the valve assembly of FIG. 5.

With additional reference to FIG. 6, an exploded view of the valve assembly 20 of FIG. 5 is illustrated. As can be seen in FIG. 6, the housing 32 is shown as a two-piece design having a first housing portion 32a and a second housing portion 32b acting as a cover to the first housing portion 32a. The first housing portion 32a includes an interior chamber 32d in which the actuator 34, amplifier 36 and control electronics 38 (shown as a printed circuit board) are positioned, and in which the encapsulating material is inserted. Fasteners 37 fix the actuator 34 and amplifier 36 within the interior chamber 32d of the first housing portion 32a, while the control electronics 38 are attached to the second housing portion 32b (e.g., via a snap connection means or other connection means). Cables 39 of the control electronics 38 pass through opening 32c for connection to a remote device (not shown). Gasket 32e is arranged between the first housing portion 32a and the second housing portion 32b, and fasteners 33 fix the second housing portion 32b to the first housing portion 32a.

Upon the valve assembly 20 being assembled, the insulating material 40 may be injected into the chamber 32c via injection hole 32f, and any air in the chamber 34d may be evacuated through vent hole 32g. To provide optimal encapsulation, the electrical components of the actuator 34 and control electronics 38 should be completely encased.

FIG. 7 illustrates the exemplary valve assembly 20 of FIG. 5 in cross-section along plane A-A. As can be seen in FIG. 7, bores 33a are formed in the first housing portion 32a for receiving the fasteners 33 that hold the second housing portion 32b to the first housing portion 32a. An opening 42 in the first housing portion 32a in the region of the valve 22 enables a valve actuation member 22a to pass through the first housing portion 32a for mechanical coupling to the actuator 34 and/or amplifier 36 via coupling lug 44 (e.g., coupling lug 44 being mechanically attached to pivotable arm 56 or 58 and thus to the actuator element 34). The valve 22 includes an inlet port 22b for receiving, for example, pressurized air, one or more outlet ports 22c for distributing the pressurized air, and an exhaust port 22d. When the valve 22 is in the off state, the inlet 22b is not in fluid communication with the one or more outlet ports 22c and thus there is no flow through the valve 22. Outlet port 22c is in fluid communication with exhaust port 22d when the valve 22 is in the off state. While in the on state the inlet port 22b is in fluid communication with the one or more outlet ports 22c and thus air may flow through the valve 22. An access passage 32h is arranged in the first housing part 32a to enable adjustment of actuator stroke. A plug 32i is arranged in the access passage 32h to prevent the insulating material 40 from exiting the housing 32 via the access passage 32h.

The valve assembly 20 in accordance with the present disclosure enables the use of piezoelectric actuation technology in commercial applications where the use of high voltage would normally have been a concern. In particular, the valve assembly in accordance with the present disclosure enables use of piezoelectric actuation technology in applications in which spark generation during electrical events (e.g., due to high capacitance of the piezoelectric element and other electrical components of the control electronics 38) would be unacceptable.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An actuator assembly, comprising:
   a housing comprising an interior portion, an exterior portion, and a through hole between the interior portion and the exterior portion;
   an actuator arranged within the housing, the actuator including a first part and a second part movable relative to the first part;
   an amplifier arranged within the housing and mechanically coupled to the actuator, the amplifier operative to amplify a displacement of the second part;
   an actuation member passing through the through hole, the actuation member mechanically coupled to the amplifier; and
   an insulating material disposed within the housing, the insulating material encapsulating at least the second part of the actuator and the amplifier, wherein the insulating material comprises a gel.

2. The actuator assembly according to claim 1, further comprising a valve assembly attached to an external surface of the housing and operatively coupled to the actuation member to selectively open and close a valve of the valve assembly by actuation of the encapsulated actuator.

3. The actuator assembly according to claim 2, wherein the valve comprises at least one of a spool valve or a poppet valve.

4. The actuator assembly according to claim 1, wherein the actuator comprises a piezoelectric actuator.

5. The actuator assembly according to claim 1, wherein the movable part comprises a piezoelectric element.

6. The actuator assembly according to claim 1, further comprising electronics arranged within the housing and configured to control movement of the second part relative to the first part, the insulating material encapsulating the electronics.

7. The actuator assembly according to claim 1, wherein the insulating material comprises a silica gel.

8. The actuator assembly according to claim 1, wherein the insulating material comprises a dielectric gel.

9. The actuator assembly according to claim 1, wherein the amplifier comprises a pivotable folded-back arm actuator configuration.

10. The actuator assembly according to claim 1, wherein a gain of the amplifier is between 25 and 35.

11. The actuator assembly of according to claim 6, wherein the electronics comprise a printed circuit board.

12. An actuator assembly, comprising:
- a housing comprising an interior portion, an exterior portion, and a through hole between the interior portion and the exterior portion;
- an actuator arranged within the housing, the actuator including a first part and a second part movable relative to the first part;
- an amplifier arranged within the housing and mechanically coupled to the actuator, the amplifier operative to amplify a displacement of the second part;
- an actuation member passing through the through hole, the actuation member mechanically coupled to the amplifier; and
- an insulating material disposed within the housing, the insulating material encapsulating at least the second part of the actuator and the mechanical coupling between the second part of the actuator and the amplifier, wherein the insulating material comprises a gel.

* * * * *